United States Patent
Ermisch et al.

(10) Patent No.: US 7,969,139 B2
(45) Date of Patent: Jun. 28, 2011

(54) ROGOWSKI SENSOR AND METHOD FOR MEASURING A CURRENT

(75) Inventors: Jochen Ermisch, Radebeul (DE); Uwe Hering, Berlin (DE); Frank Thieme, Dresden (DE); Ralf-Reiner Volkmar, Oldenburg i.H. (DE)

(73) Assignee: Siemens Aktiengesellschaft, Munich (DE)

( * ) Notice: Subject to any disclaimer, the term of this patent is extended or adjusted under 35 U.S.C. 154(b) by 54 days.

(21) Appl. No.: 12/519,812

(22) PCT Filed: Dec. 12, 2007

(86) PCT No.: PCT/EP2007/063834
§ 371 (c)(1),
(2), (4) Date: Jun. 18, 2009

(87) PCT Pub. No.: WO2008/077798
PCT Pub. Date: Jul. 3, 2008

(65) Prior Publication Data
US 2010/0013460 A1     Jan. 21, 2010

(30) Foreign Application Priority Data
Dec. 21, 2006   (DE) .................. 10 2006 061 923

(51) Int. Cl.
*G01R 33/00* (2006.01)
(52) U.S. Cl. ............. 324/117 R; 324/126; 324/127
(58) Field of Classification Search ............ 324/117 R, 324/117 H, 126–127, 250–252
See application file for complete search history.

(56) References Cited

U.S. PATENT DOCUMENTS

| 3,434,052 | A | | 3/1969 | Fechant |
| 6,064,191 | A | * | 5/2000 | Turner .................. 324/127 |
| 6,184,672 | B1 | * | 2/2001 | Berkcan ............... 324/117 R |
| 6,313,623 | B1 | * | 11/2001 | Kojovic et al. ........... 324/127 |

(Continued)

FOREIGN PATENT DOCUMENTS

DE          19825383 A1      12/1999

(Continued)

OTHER PUBLICATIONS

Guo Xiahua et al: "Improved performance rogowski coils for power system," 2003 IEEE PES Transmission and Distribution Conference. Conference Proceedings. Dallas, TX, Sep. 7-12, 2003, IEEE/PES Transmission and Distribution Conference and Exposition, New York, NY: IEEE, US, vol. 3 of 3, Sep. 7, 2003, pp. 371-374, XP010725157 ISBN: 0-7803-8110-6.

(Continued)

*Primary Examiner* — Ha Tran T Nguyen
*Assistant Examiner* — Joshua Benitez
(74) *Attorney, Agent, or Firm* — Laurence A. Greenberg; Werner H. Stemer; Ralph E. Locher

(57) ABSTRACT

A Rogowski sensor is provided for measuring a current of an electrical conductor. The sensor has a Rogowski coil, which has an electrical winding resistor, and an integration device which is connected to the Rogowski coil and is intended to generate an output signal which is proportional to the electrical current to be measured by the Rogowski sensor. The integration device is formed by the winding resistor of the Rogowski coil and a capacitance which is connected to the two winding connections of the Rogowski coil, and for the output signal from the integration device to be formed by the voltage applied to the capacitance.

13 Claims, 7 Drawing Sheets

U.S. PATENT DOCUMENTS

| | | | |
|---|---|---|---|
| 6,366,076 B1 * | 4/2002 | Karrer et al. | 324/117 R |
| 6,614,218 B1 * | 9/2003 | Ray | 324/117 R |
| 7,521,916 B2 * | 4/2009 | Deck et al. | 324/110 |

FOREIGN PATENT DOCUMENTS

| | | |
|---|---|---|
| EP | 1615039 A1 | 1/2006 |
| JP | 58005668 A | 1/1983 |

OTHER PUBLICATIONS

Radum A et al: "An Alternative Low-Cost Current-Sensing Scheme for High-Current Power Electronics Circuits," Oct. 7, 1990, Conference Record of the Industry Applications Society Annual Meeting. Seattle, Oct. 7-12, 1990, New York, IEEE, US, pp. 619-625, XP000204088 ISBN: 0-87942-553-9.

* cited by examiner

ROGOWSKI SENSOR AND METHOD FOR MEASURING A CURRENT

CROSS REFERENCE TO RELATED APPLICATIONS

The present application claims priority of German Patent Application No. DE 10 2006 061 923.4 filed on Dec. 21, 2006 and is a national stage application under 35 U.S.C. §371 of International Patent Application No. PCT/EP07/63834 filed on Dec. 12, 2007.

BACKGROUND OF THE INVENTION

1 Field of the Invention:

The invention relates to a Rogowski sensor having the features in accordance with the preamble of claim 12.

Such a Rogowski sensor is known, for example, from the German laid-open patent application DE 198 25 383 A1. The previously known Rogowski sensor serves for measuring a current of a conductor, and comprises a Rogowski coil having an electrical winding resistance, and an integration device connected to the Rogowski coil. The integration device generates an output signal that is proportional to the electric current to be measured by the Rogowski sensor. The previously known Rogowski sensor is, moreover, equipped with a resonant circuit that has a capacitor and can be used to test the correct condition of the Rogowski curve.

BRIEF SUMMARY OF THE INVENTION

The invention is based on the object of specifying a Rogowski sensor that is as simply and as cost-effectively designed as possible and yet supplies accurate measurement results.

This object is achieved according to the invention by a Rogowski sensor having the features in accordance with claim 12. Advantageous refinements of the inventive Rogowski sensor are specified in subclaims.

Consequently, it is provided in accordance with the invention that the integration device is formed by the winding resistance of the Rogowski coil and a capacitance connected to the two winding terminations of the Rogowski coil, and that the output signal of the integration device is formed by the voltage present across the capacitance.

A substantial advantage of the inventive Rogowski sensor is to be seen in that there is no need for a separate integration device; the point is that in the case of the invention the integration device is formed solely by a capacitance and the winding resistance of the Rogowski coil.

A further substantial advantage of the inventive Rogowski sensor is to be seen in that despite the simple design, a display of the time profile that is good in terms of quality and quantity and electrically isolated results, this being so both for operating currents and for high short circuit currents with a slowly decaying transient DC component (direct current component) over a large time period.

An additional substantial advantage of the inventive Rogowski sensor consists in that a drive-independent linear response without saturation effect or limitation effect is achieved by the use of a passive integrator comprising the winding resistance and the capacitance. Thus, for example, neither drift nor offset drift occur.

A further substantial advantage of the inventive Rogowski sensor is based on the fact that by appropriately selecting the specific resistance and/or the cross section of the winding wire it is easily possible to adapt the Rogowski sensor to the required transmission properties on the one hand, and to the requirements of winding technology on the other hand.

The capacitance is formed with particular simplicity and therefore advantageously by a capacitor.

With regard to the most accurate measurement results possible, it is regarded as advantageous when the capacitance Ci and the winding resistance Rr are dimensioned in such a way that the following holds:

$$Rr*Ci > 1/(2*\pi*f)$$

f denoting the frequency of the current to be measured, for example the fundamental frequency or the nominal frequency. The frequency is usually 50 Hz or 60 Hz.

In order to obtain an optimum integration response, the following relationship is particularly preferably observed:

$$Rr*Ci >> 1/(2*\pi*f), \text{ for example in accordance with}$$

$$Rr*Ci > 100/(2*\pi*f)$$

These values can be set with particular ease when the winding resistance is at least 1 kΩ, preferably between 10 kΩ and 100 kΩ. Moreover, it is possible with the aid of such a large winding resistance to keep the current in the Rogowski coil relatively low, and thus for the back ampere turns likewise to remain low.

The specific resistance of the winding wire of the winding is preferably at least 0.05 Ωmm²/m. The conductor cross section of the winding wire of the winding preferably lies in the range of 0.005 mm² to 0.05 mm².

The Rogowski coil preferably has a winding with at least 1000 turns; for example, the number of turns per unit length is between 5000 and 10 000. A large number of turns per unit length leads to the usually desired high open-circuit voltage without the occurrence of insulation problems, because the induced voltage decreases linearly along the winding resistance.

With reference to the capacitance, capacitance values of at least 1 μF are regarded as preferred. It is particularly preferred for the capacitance to lie in the range between 1 μF and 100 μF.

If the capacitor is connected to the two winding terminations of the Rogowski coil indirectly, in particular via an electric transmission line, said capacitor can be positioned separately from the Rogowski coil. Any possible disturbances coupled into the transmission line do not, however, show up disturbingly, because they are short circuited by the capacitor.

Alternatively, the capacitor can also be connected directly to the two winding terminations of the Rogowski coil.

The invention likewise relates to a method for measuring a current of a conductor with the aid of a Rogowski coil having an electrical winding resistance, integration being performed during the method in order to generate an output signal that is proportional to the electric current to be measured by the Rogowski sensor. Such a method is likewise known from the German laid-open patent application DE 198 25 383 A1 mentioned at the beginning.

The invention is therefore based on the object of specifying a method which allows this to be carried out in a simple and cost-effective manner.

The object is achieved in accordance with the invention by virtue of the fact that the integration is carried out with the aid of the winding resistance of the Rogowski coil and a capacitance connected to the two winding terminations of the Rogowski coil, and that the voltage present across the capacitance is output as output signal.

With reference to the advantages of the inventive method, and with reference to advantageous refinements of the inventive method, reference may be made to the above statements in relation to the inventive Rogowski sensor, since the advantages of the inventive method correspond to those of the inventive Rogowski sensor.

BRIEF DESCRIPTION OF THE SEVERAL VIEWS OF THE DRAWING

The invention is explained in more detail below with the aid of exemplary embodiments; by way of example in this case.

For reasons of clarity, the same reference symbols are used in FIGS. 1 to 9 for identical or comparable components.

DESCRIPTION OF THE INVENTION

Figure 1:
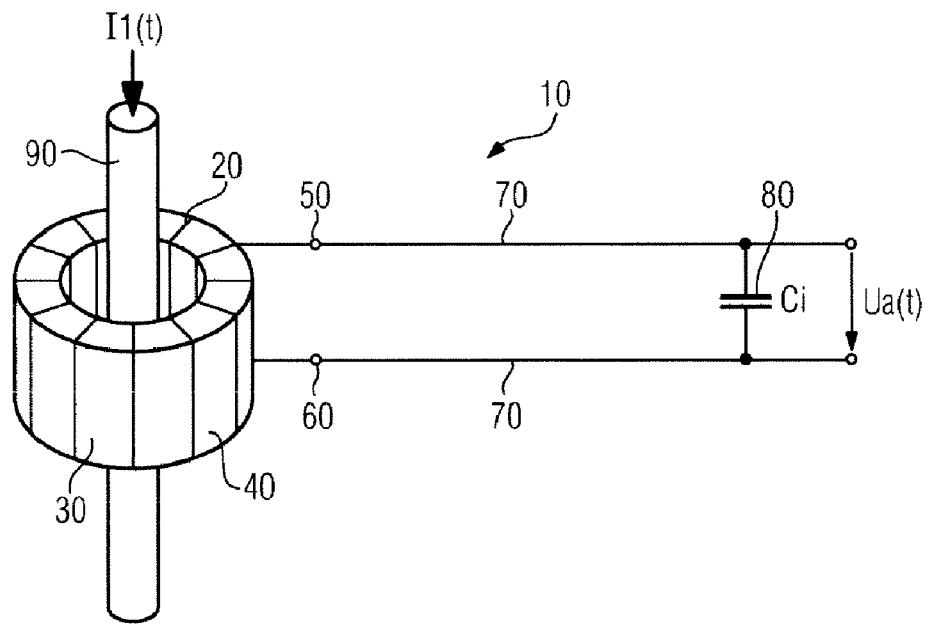
FIGS. 1-2 show a first exemplary embodiment of an inventive Rogowski sensor.

FIG. 1 is a schematic of an exemplary embodiment of a Rogowski sensor 10. A Rogowski coil 20 is to be seen that has an annular winding support 30 that supports a uniformly distributed ring winding 40 with a high number of turns per unit length N (for example N=1000) and a high winding resistance Rr (for example Rr=100 kΩ).

Connected to the two winding terminations 50 and 60 of the Rogowski coil 20 is an electric transmission line 70 which connects the Rogowski coil 20 to a capacitor 80. The transmission line 70 is preferably formed by a shielded line, for example by one having two twisted individual conductors. The capacitor 80 electrically forms a capacitance Ci, and thus an "integration capacitor". A voltage Ua(t), which forms the output signal of the Rogowski sensor 10, is dropped at the terminals of the capacitor 80.

The Rogowski sensor 10 can be used to measure the current $I1(t)$—also termed primary current below—of a primary conductor 90.

Figure 2:
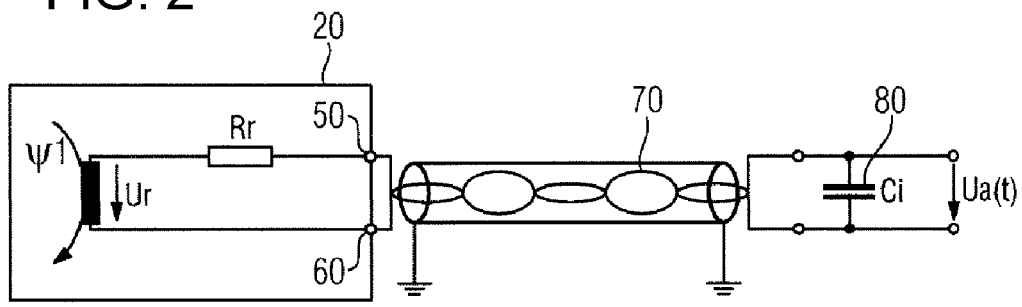

FIG. 2 is a schematic of the electrical equivalent circuit diagram of the Rogowski sensor 10 in accordance with FIG. 1. It is to be seen that the Rogowski coil 20 forms the winding resistance Rr that is connected to an induced voltage Ur. The induced voltage Ur is based on the magnetic flux linkage $\Psi 1$ with the magnetic flux of the current $I1(t)$ of the conductor 90.

The output voltage Ua(t) is yielded from the voltage Ur induced in the mutual inductance $M_{21}$ of the Rogowski coil 20 and originating from the primary current $I1(t)$ and the divider ratio of the complex voltage divider composed of winding resistance Rr and the integration capacitor Ci. It holds that:

$$Ua(t) = M_{21} * j2\pi f * \frac{1}{(j2\pi f * Rr * Ci) + 1} * I1(t)$$

f denoting the frequency of the current $I1(t)$ to be measured. It holds for $2\pi * f * Rr * Ci \gg 1$ that.

$$Ua(t) = M_{21} * \frac{1}{Rr * Ci} * I1(t)$$

The mutual inductance can be calculated in accordance with:

$$M_{21} = \frac{W_1 * W_2 * A_{eff} * \mu_0}{\pi * (r_i + r_a)}$$

where $W_1$ is the number of turns per unit length of the primary circuit, here $W_1=1$, since the primary conductor is guided only once through the sensor (multiple guiding through is also possible in principle, but is capable of being implemented only with more difficulty in terms of design), $W_2$ is the number of turns per unit length of the sensor, $R_i$ is the inside radius of the sensor coil, $r_a$ is the outside radius of the sensor coil, and $A_{eff}$ is the effective area turns of the sensor coil.

Consequently, the following relationship between primary current $I1(t)$ and output voltage Ua(t) is yielded for a sensor with the primary number of turns per unit length $W_1=1$:

$$Ua(t) = \frac{W_2 * A_{eff} * \mu_0}{\pi * (r_i + r_a)} * \frac{1}{Rr * Ci} * I1(t).$$

Alternatively, the output voltage Ua(t) can also be calculated via the flux linkage.

The output voltage Ua is yielded in this case from the voltage Ur induced in the winding of the sensor by the flux linkage and originating from the primary current $I1(t)$ and the divider ratio of the complex voltage divider composed of winding resistance Rr and integration capacitor Ci:

$$Ur = 2\pi f * \Psi_1$$

$$\Psi_1 = \frac{W_1 * W_2 * A_{eff} * \mu_0}{2\pi * \frac{r_i + r_a}{2}} * 1 = \frac{W_1 * W_2 * A_{eff} * \mu_0}{\pi * (r_i + r_a)} * I1(t)$$

$$Ua(t) = j2\pi f * \frac{W_1 * W_2 * A_{eff} * \mu_0}{\pi * (r_i + r_a)} * = \frac{1}{(j2\pi f * Rr * Ci) + 1} * I1(t)$$

It holds for $2\pi f * R_r * C_i \gg 1$ that:

$$Ua(t) = \frac{W_1 * W_2 * A_{eff} * \mu_0}{\pi * (r_i + r_a)} * \frac{1}{Rr * Ci} * I1(t).$$

Again, it is yielded for a sensor with the primary number of turns per unit length $W_1=1$ that:

$$Ua(t) = \frac{W_2 * A_{eff} * \mu_0}{\pi * (r_1 + r_a)} * \frac{1}{Rr * Ci} * I1(t).$$

In radian measure, the phase displacement angle δ between $I1(t)$ and Ua(t) is:

$$\delta = \arctan(2\pi f * Rr * Ci) \frac{\pi}{2}.$$

It may therefore be stated in summary that observance of the dimensioning rule $$2\pi f * Rr * Ci >> 1$$

results in an integration of the voltage Ur solely by the winding resistance Rr of the Rogowski coil 20 and the capacitor Ci, there being no need for an additional external integration device.

Figure 3:
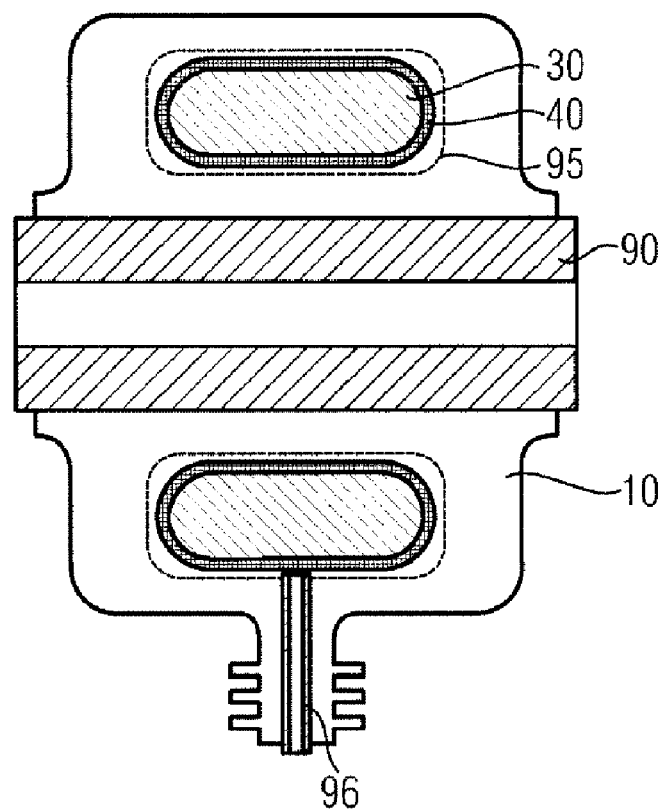
FIGS. 3-4 show a second exemplary embodiment of an inventive Rogowski sensor.

FIG. 3 shows a sectional view of a further exemplary embodiment of a Rogowski sensor 10; this exemplary embodiment is a cast resin design.

The Rogowski sensor 10 enables a very accurate display of the time profile of a current to be measured in the range of operating currents up to high fully displaced short circuit currents with a slowly decaying DC component. A temporally correct display of the current zero crossings is also achieved.

A winding 40 with 10 000 turns made from 0,1 mm Cu—Ni enamel-insulated wire is applied to an annular winding support 30 in a fashion uniformly distributed over the circumference, bandaged and elastically precast. The correspondingly pretreated winding 40 is provided with a shield. The assembly is precast with casting resin concentrically around a copper bolt as primary conductor 90. A conductive layer 95 can serve for the purpose of potential control. Nominal voltages of up to 24 kV can be implemented in the case of the sensor 10 in accordance with FIG. 3.

The winding terminations of the Rogowski coil 20 are guided out via a shielded tube 96, for example by means of a shielded twisted two-wire line. The integration capacitor is not shown in FIG. 3; this is arranged directly on the electronic module for signal processing. This has the advantage that disturbances coupled into the line are largely diverted away by the capacitor.

The integration capacitor is formed, for example, by a parallel circuit of MKT capacitors and RF capable COG ceramic capacitors. MKT capacitors are cost-effective and attain the required capacitance with a relatively small design volume. The parallel connection of COG capacitors results in a filter action for radio frequency disturbance injections.

No particular requirements are placed on tolerances and temperature response of the capacitors for simple protection and measurement applications. There are likewise no special requirements placed on the dielectric strength of the capacitors owing to the functional principle. The required dielectric strength corresponds to the peak value of the output voltage Ua plus a safety factor.

The Rogowski coil 20 should be operated only with a connected capacitor—like a current transformer, which may only be operated with an impedance load—because otherwise there could be a risk of disruptive discharges in the winding.

Figure 4:
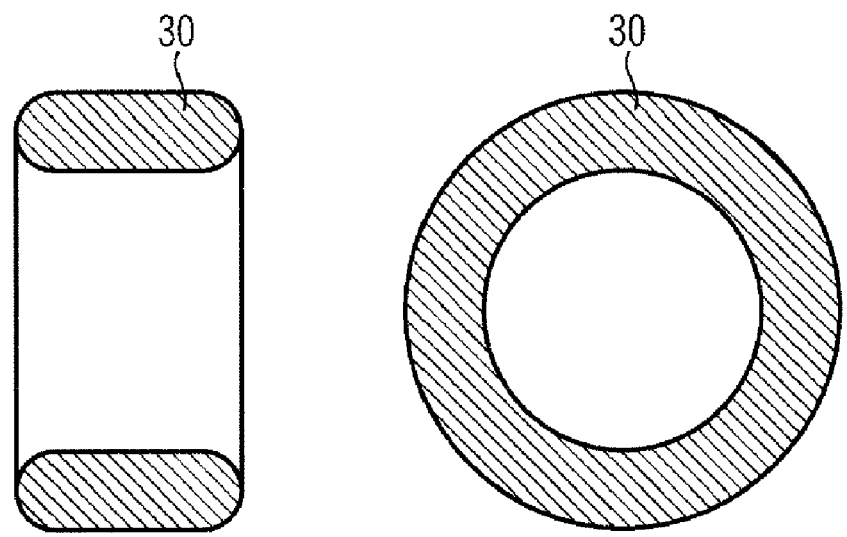

FIG. 4 shows the winding support 30 in longitudinal section (at left) and in cross section (at right). The winding support 30 is, for example, produced as a turned part made from fabric based laminate, and ground. The winding is preferably applied with the aid of a precision ring winding machine.

When use is made of ISOTAN (CuNi44) as winding material, the following technical data can result by way of example when a Rogowski sensor is to be produced for applications with currents of up to 80 kA:

number of turns per unit length: 10 000
wire: 0.1 mm ISOTAN enamel-insulated wire
effective area turns: 0.00183 m²
effective magnetic path length: 0.361 m
Rr (winding resistance): 110 kOhm
Lr (self-inductance): 0.634 H
self-reactance at 50 Hz: 197 Ohm (<<Rr)
Ur (induced open-circuit voltage, f=50 Hz):

| | |
|---|---|
| for I = 1 A: | 0.0199 V |
| for In = 1250 A: | 24.9 V |
| for Idyn = 80 kA: | 1.59 kV | integrator time constant: 2 s
phase displacement angle resulting therefrom for 50 Hz: 0.1°
Ci (integration capacitor): 18.2 µF
dielectric strength:
  50 V for COG capacitors
  63/100 V for MKT capacitors
Ua (voltage across integration capacitor):

| | |
|---|---|
| for I = 1 A: | 31.8 µV |
| for In = 1.250 A: | 39.8 mV |
| for Idyn = 80 kA: | 2.55 V |

The dynamic response of the Rogowski sensor 10 in accordance with FIGS. 3 and 4 was simulated with the aid of a mathematical model. The model neglected the back ampere turns that are built up by the secondary current through the Rogowski coil, since said back ampere turns are only 0.18% of the primary ampere turns. Owing to this neglect, the weakly fed back system is transformed into a system without feedback, and this leads to greater stability in the simulation.

Figure 5:
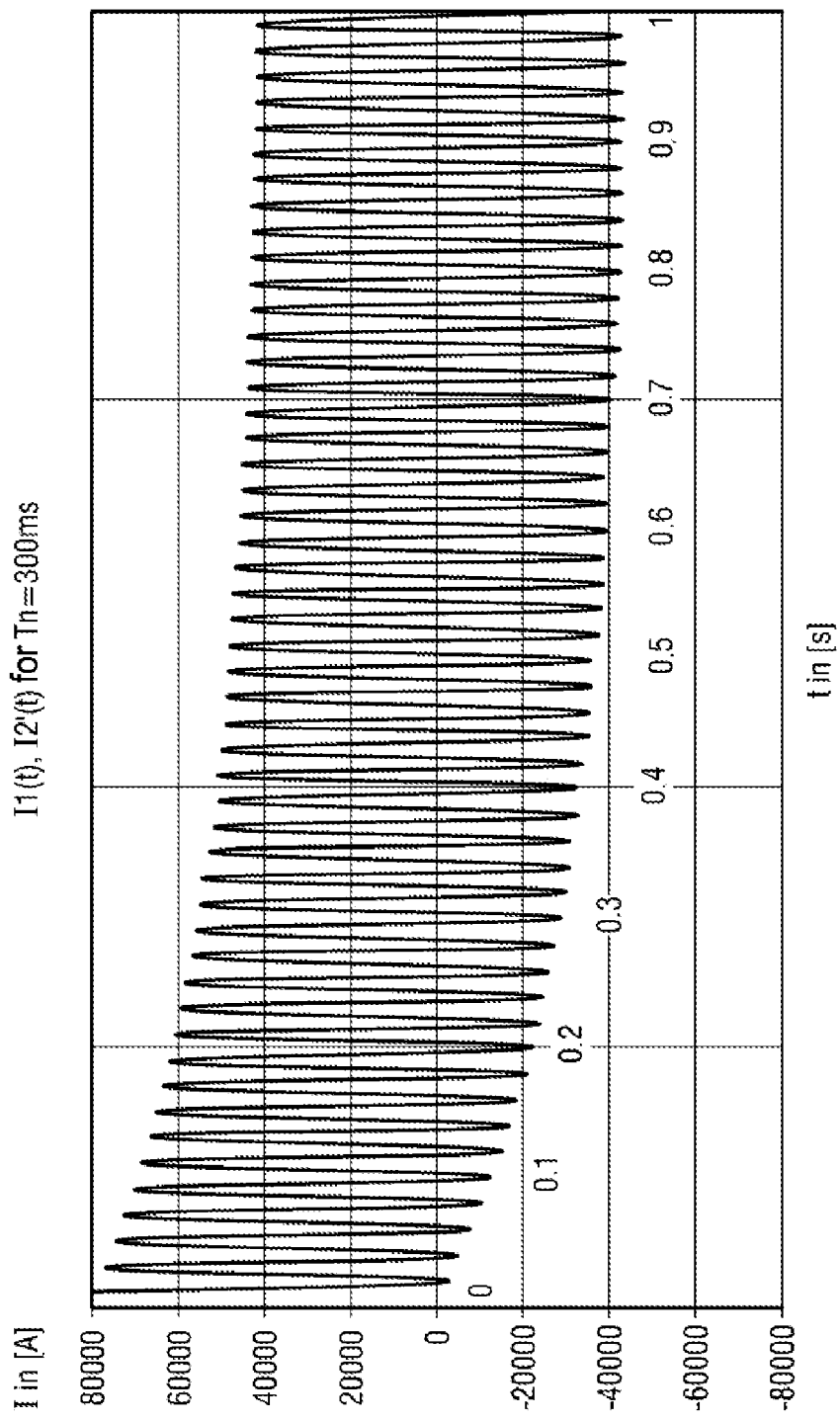
FIGS. 5-8 show the electrical response of the Rogowski sensor in accordance with FIGS. 3-4.

FIG. 5 shows the profile of the primary current $I1(t)$ and the secondary voltage Ua, scaled as $I2'(t)$ onto the primary current, for a fully displaced short circuit current Idyn=80 kA with a system time constant of 300 ms for the Rogowski sensor according to FIG. 3. It is to be seen that the two profiles lie one upon another, as it were, and can scarcely be separated from one another in the illustration in accordance with FIG. 5.

Owing to the non-infinite integrator time constant (T=2 s) of the Rogowski sensor 10, the displaced DC component in the secondary signal decays more quickly than in the primary current. For a system time constant of 300 ms, for example, this results after approximately 0.6 s (see also FIG. 6) in a maximum error of approximately 0.33 ms in the display of the current zero crossings.

This error can certainly be reduced by enlarging the integrator time constant, but this leads to a lower output voltage Ua in conjunction with an otherwise identical design of the Rogowski coil. This can be countered within the bounds of the available volume by enlarging the number of turns per unit length and/or the effective area turns of the coil.

Figure 6:
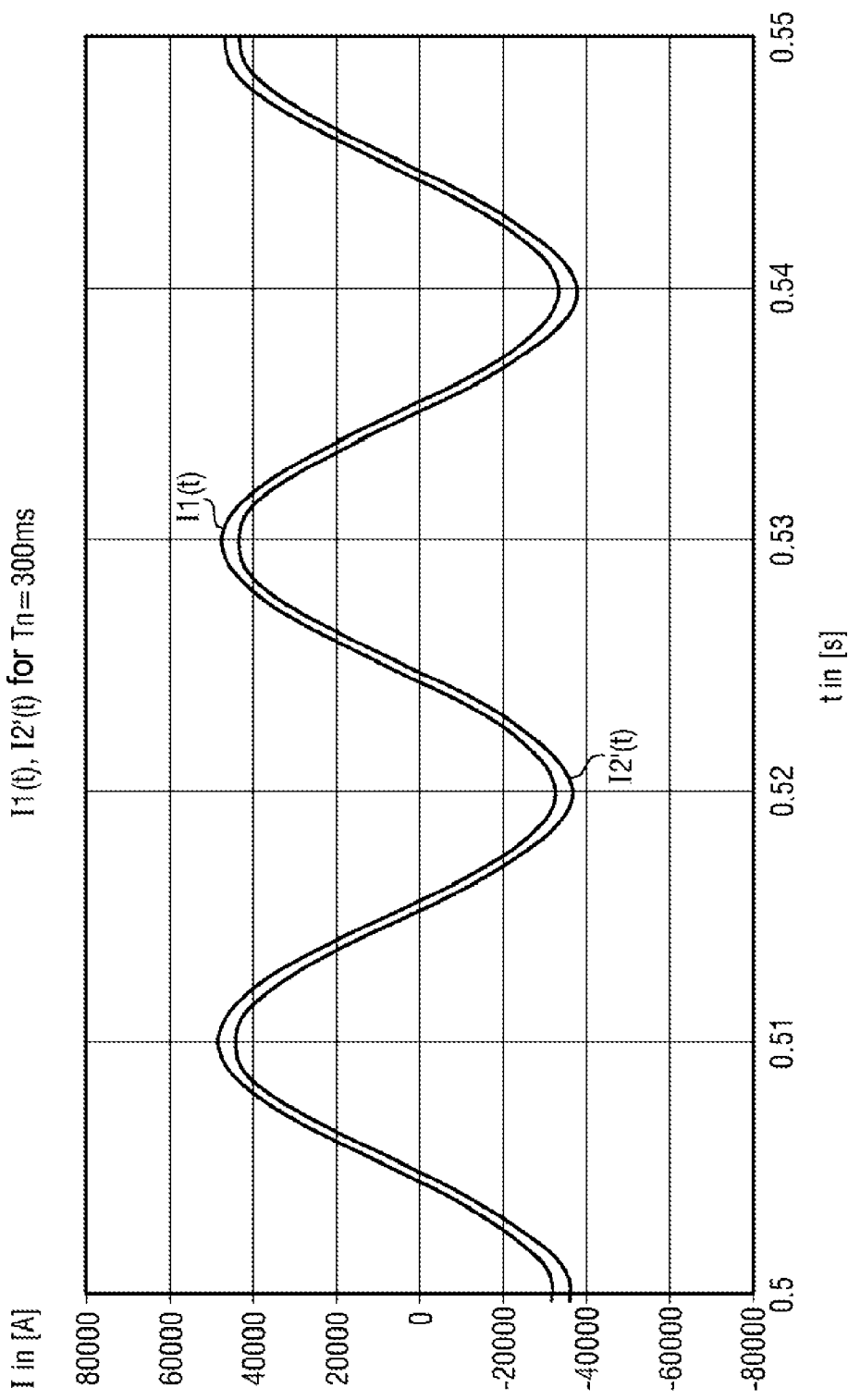

FIG. 6 shows the transmission of a fully displaced short circuit current for Tn=300 ms and Idyn=80 kA once again as an extract.

Figure 7:
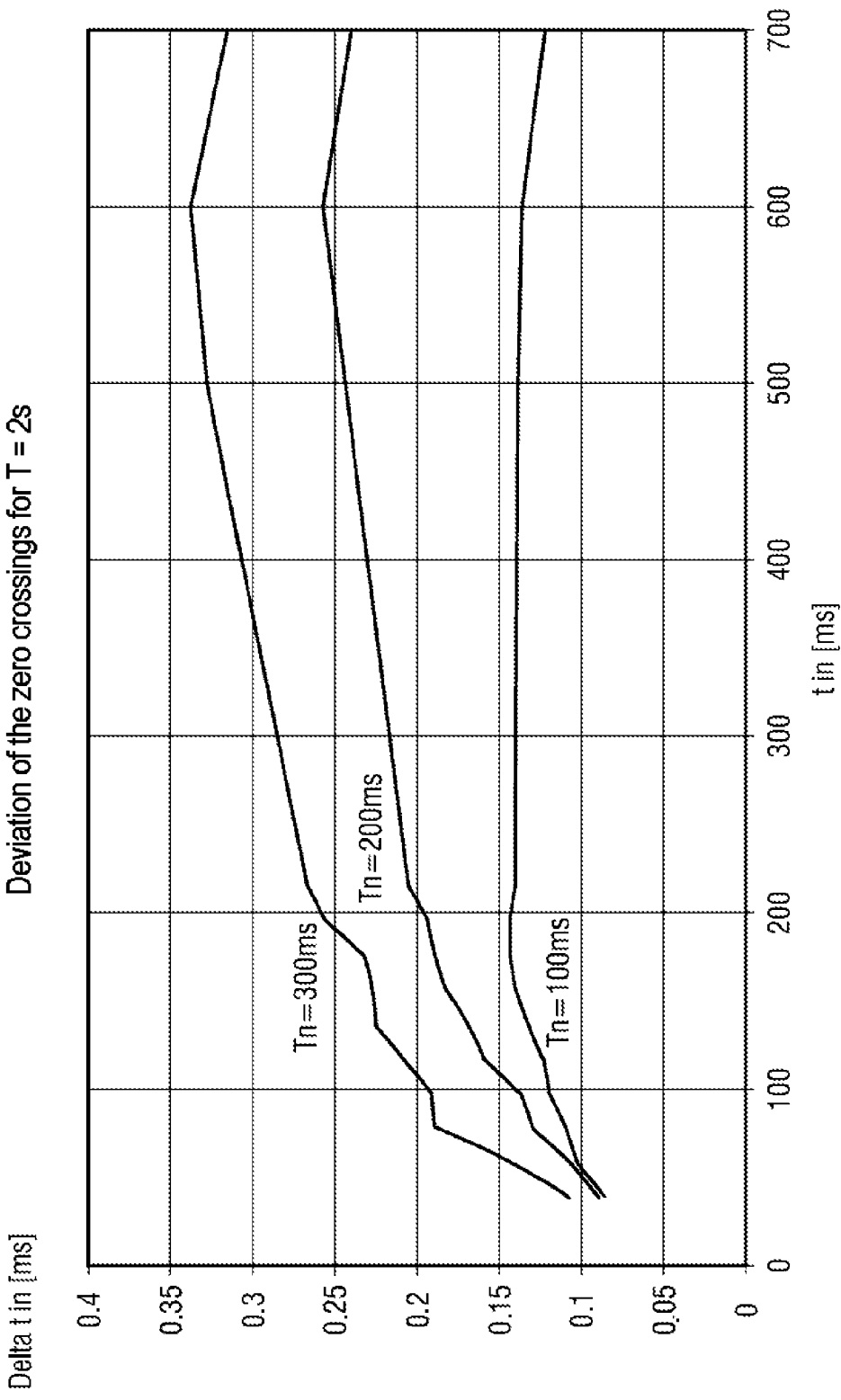

FIG. 7 shows the dependence of the display of the zero crossings on time for various system time constants for a Rogowski sensor with an integrator time constant of T=2 s.

Figure 8:
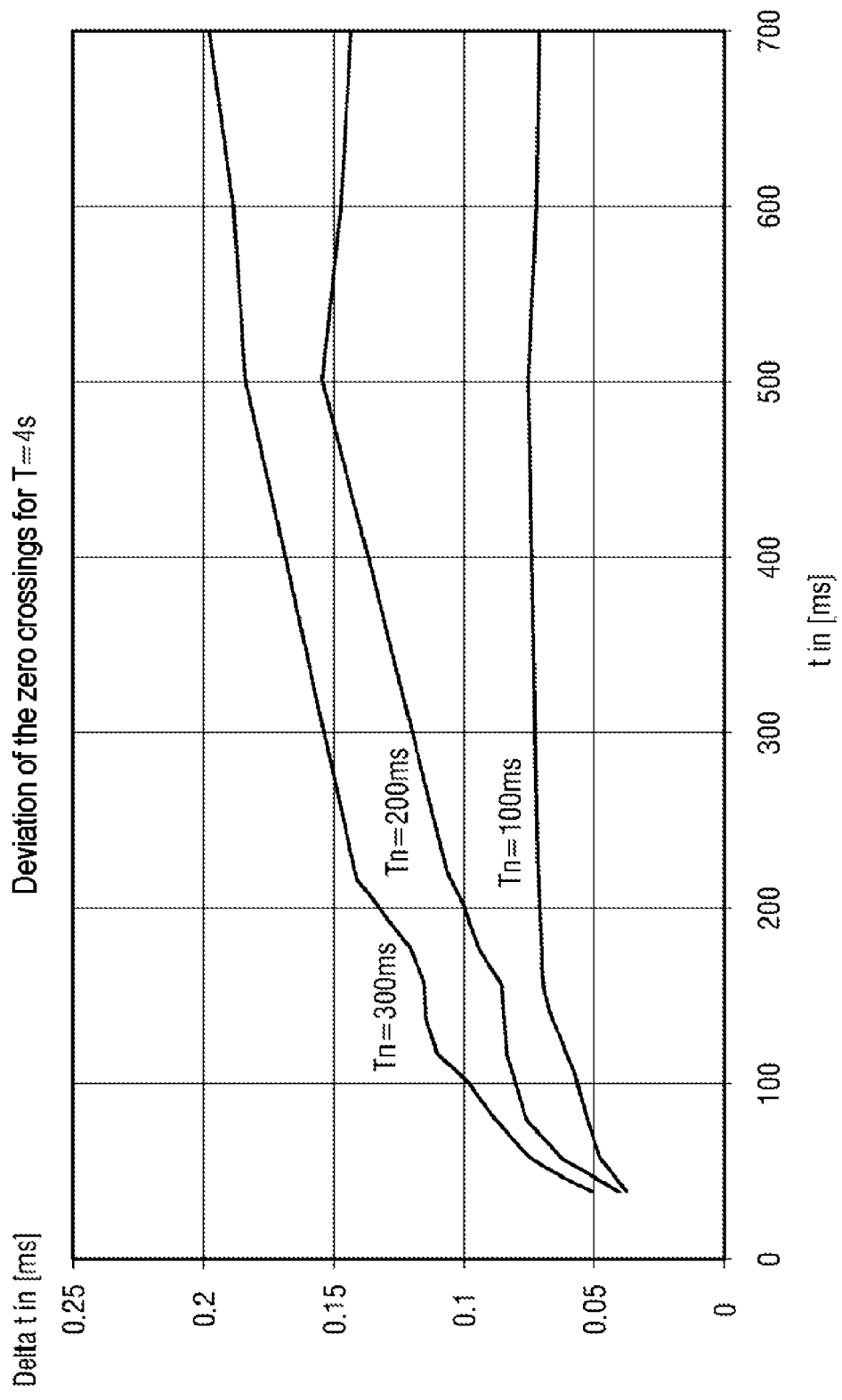

FIG. 8 shows the dependence of the display of the zero crossings on time for various system time constants for a Rogowski sensor with an integrator time constant of T=4 s. An even better display of the zero crossings could be achieved with a further enlargement of the indicator time constant. However, the enlargement of the integrator time constant is limited by the available volume, the winding technology and parasitic effects such as winding capacitance.

Figure 9:
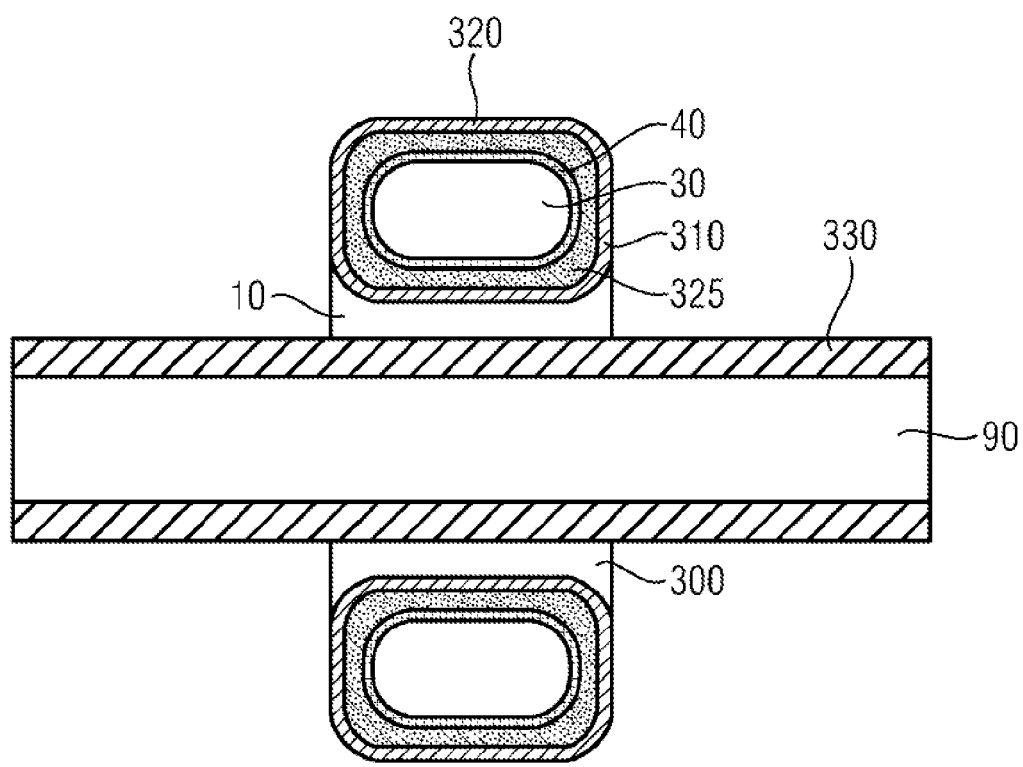
FIG. 9 shows a third exemplary embodiment of an inventive Rogowski sensor.

FIG. 9 shows a third exemplary embodiment of a Rogowski sensor 10. This exemplary embodiment is a slip-on sensor for insulated busbars or insulated cable cores in medium voltage switchgear and low voltage switchgear. The Rogowski sensor 10 is located in an aluminum housing 300 with an aluminum cladding 310 that serves as shield and mechanical protection. The aluminum cladding 310 has a circumferential insulating joint 320 such that the aluminum cladding 310 cannot act as a short circuit winding, and the measurement result is not corrupted. A sealing compound 325 retains the winding support inside the aluminum cladding 310.

The insulation from the medium voltage potential or low voltage potential is achieved by the insulation 330 of the primary conductor 90, which is formed, for example, by a busbar or cable core and is pushed through the Rogowski sensor 10.

The dimensioning of the Rogowski coil 20 and of the integration capacitor can differ greatly depending on the respective application, but is preferably distinguished in that the winding resistance is high (in the range from approximately 1 kΩ to approximately 100 kΩ, in practice) such that it operates in conjunction with the capacitor (range approximately 1 μF to 100 μF) as integrator for the frequency range of interest. This also obtains when it holds that:

$$\frac{1}{2\pi f} << Rr * Ci$$

The following are crucial for the design
the primary current to be measured,
the required output voltage,
the permissible phase displacement angle,
the required time constant, in order to be able to display transient processes correctly, and
the maximum installation dimensions.

Moreover, the following parameters influence the idealized theoretical transmission response:
average area turns,
number of turns per unit length,
winding resistance (resulting from number of turns per unit length, wire cross section, specific resistance of the winding wire),
average magnetic path length (resulting from inside radius and outside radius of the ring coil), and
capacitance of the integration capacitor.

Variations from the idealized transmission response result for the most part from winding capacitances. These act particularly in the case of a large number of turns per unit length and a large specific resistance of the winding wire. Calculations reveal that the winding resistance preferably should not greatly exceed values in the region of 100 kΩ. A guide value of approximately 10 000 turns can be regarded as the maximum number of turns per unit length. This value also constitutes a reasonable limit for the production costs with regard to production engineering.

With regard to costs and installation size of the integration capacitor, it should be designed such that the capacitance of the capacitor does not exceed the region of 100 μF, in particular whenever stringent requirements placed on the measuring accuracy and the permissible phase displacement angle are to be fulfilled. Capacitors with low tolerances and small temperature coefficients are expensive as a rule and available only with limited capacitance. The capacitance features directly in the transmission factor from secondary voltage to primary current. Cost-effective MKT capacitors, for example, can be used for simple protection applications and operational measurements.

By way of example, a Rogowski sensor having the structure according to FIG. 9 can be designed for the following requirements:

| Primary rated current: | In = 600 A |
| Short circuit current: | Ik = 20*In = 12 000 A |
| Dynamic short circuit current: | Idyn = 2.5*Ik = 30 000 A |
| Peak value of the output voltage: | Ua = 2.5 V |
| Rated frequency: | fn = 50 Hz |
| Measurement deviation: | F = 1% |
| Phase displacement angle: | δ = 1° at rated frequency |

Said requirements are fulfilled, for example, by a Rogowski sensor having the following properties:

| Integration capacitor: | Ci = 20 μF |
| Winding resistance: | Rr = 10 kΩ |
| Time constant: | T = 0.2 s |
| Number of turns per unit length: | W2 = 2000 |
| Inside radius: | $r_1$ = 0.035 m |
| Outside radius: | $r_a$ = 0.06 m |
| Effective area turns: | $A_{eff}$ = 0.00198 m$^2$ |

The invention claimed is:

1. A Rogowski sensor for measuring a current of a conductor, the Rogowski sensor comprising:
a Rogowski coil having an electrical winding resistance and two winding terminations; and
an integration device for generating an output signal that is proportional to the current to be measured by the Rogowski sensor, said integration device being formed by said electrical winding resistance of said Rogowski coil and a capacitance connected to said two winding terminations of said Rogowski coil, said integration device outputting an output signal formed by a voltage present across said capacitance.

2. The Rogowski sensor according to claim 1, wherein said capacitance is formed by a capacitor.

3. The Rogowski sensor according to claim 2, further comprising an electric transmission line, said capacitor is connected indirectly to said two winding terminations of said Rogowski coil via said electric transmission line.

4. The Rogowski sensor according to claim 2, wherein said capacitor is connected directly to said two winding terminations of said Rogowski coil.

5. The Rogowski sensor according to claim 1, wherein said capacitance Ci and said electrical winding resistance Rr are dimensioned in such a way that the following holds:

$Rr*Ci > 1/(2*\pi*f)$ f denoting a frequency of the current to be measured.

6. The Rogowski sensor according to claim 1, wherein said capacitance Ci and said electrical winding resistance Rr are dimensioned such that the following holds:

$Rr*Ci > 10/(2*\pi*f)$ f denoting a frequency of the current to be measured.

7. The Rogowski sensor according to claim 1, wherein said electrical winding resistance lies between 10 kΩ and 200 kΩ.

8. The Rogowski sensor according to claim 1, wherein said Rogowski coil has a winding with 1,000 to 10,000 turns.

9. The Rogowski sensor according to claim 8, wherein said winding has a winding wire with a specific resistance of at least 0.05 $\Omega mm^2/m$, and in that a conductor cross section of said winding wire of said winding is 0.005 $mm^2$ to 0.05 $mm^2$.

10. The Rogowski sensor according to claim 8, wherein said winding has a winding wire with a specific resistance of at least 0.05 $\Omega mm^2/m$.

11. The Rogowski sensor according to claim 8, wherein said winding has a winding wire with a conductor cross section of 0.005 $mm^2$ to 0.05 $mm^2$.

12. The Rogowski sensor according to claim 1, wherein said capacitance is between 1 µF and 100 µF.

13. A method for measuring a current of a conductor with an aid of a Rogowski coil having an electrical winding resistance, which comprises the step of:
- performing an integration for generating an output signal that is proportional to the current to be measured, the integration being carried out with the aid of the electrical winding resistance of the Rogowski coil and a capacitance connected to two winding terminations of the Rogowski coil; and
- outputting a voltage present across the capacitance as the output signal.

* * * * *